(12) United States Patent
Ghoshal

(10) Patent No.: US 6,181,143 B1
(45) Date of Patent: Jan. 30, 2001

(54) METHOD FOR PERFORMING A HIGH-TEMPERATURE BURN-IN TEST ON INTEGRATED CIRCUITS

(75) Inventor: Uttam Shyamalindu Ghoshal, Austin, TX (US)

(73) Assignee: International Business Machines Corporation, Armonk, NY (US)

( * ) Notice: Under 35 U.S.C. 154(b), the term of this patent shall be extended for 0 days.

(21) Appl. No.: 09/307,864

(22) Filed: May 10, 1999

(51) Int. Cl.[7] .................................................. G01R 31/28
(52) U.S. Cl. ............................ 324/752; 760/501; 257/48
(58) Field of Search ..................................... 324/752, 760, 324/765, 750, 751, 501; 257/48

(56) References Cited

U.S. PATENT DOCUMENTS

| | | | |
|---|---|---|---|
| 5,422,498 | * | 6/1995 | Nikawa et al. .......................... 257/48 |
| 5,767,489 | * | 6/1998 | Ferrier .................................. 219/497 |
| 5,892,539 | * | 4/1999 | Colvin .............................. 324/760 X |
| 5,959,462 | * | 9/1999 | Lum ..................................... 324/765 |
| 5,966,019 | * | 10/1999 | Borden ................................. 324/752 |
| 5,966,022 | * | 10/1999 | Budnaitis et al. .................... 324/760 |
| 6,078,183 | * | 6/2000 | Cole, Jr. ............................... 324/752 |
| 6,091,249 | * | 7/2000 | Talbot et al. ......................... 324/751 |

* cited by examiner

Primary Examiner—Safet Metjahic
Assistant Examiner—T. R. Sundaram
(74) Attorney, Agent, or Firm—Casimer K. Salys; Felsman, Bradley, Vaden, Gunter & Dillon, LLP

(57) ABSTRACT

A method for performing a high-temperature burn-in test on integrated circuits is disclosed. A thin-film is placed on top of an integrated circuit having multiple transistors. An infra-red filter is then placed on top of the thin-film. All the transistors of the integrated circuit are radiated by an infra-red source through the thin-film and the infra-red filter when a high-temperature burn-in test is being performed.

20 Claims, 4 Drawing Sheets

METHOD FOR PERFORMING A HIGH-TEMPERATURE BURN-IN TEST ON INTEGRATED CIRCUITS

BACKGROUND OF THE INVENTION

1. Technical Field

The present invention relates to testing integrated circuits in general, and in particular to a method for performing reliability tests on integrated circuits. Still more particularly, the present invention relates to a method for performing a high-temperature burn-in test on integrated circuits.

2. Description of the Prior Art

A metal oxide semiconductor field effect transistor (MOSFET) or MOS transistor has two regions in a silicon substrate, namely, a source and a drain, which are disposed at a certain distance from each other. The MOS transistor also has an insulated gate disposed between the source and the drain. The gate is characterized by a threshold voltage ($V_{TH}$) that determines the boundary between an ON state and an OFF state in the drain current.

It is well-known in the art that the threshold voltage of a MOS transistor changes as a function of temperature due to the availability of mobile electrons and other factors. Specifically, the threshold voltage decreases as temperature increases. This creates a problem for most integrated circuit (IC) designs because some qualification tests, such as a burn-in test, are required to be performed at high temperatures. Because the threshold voltages of the transistors are generally lower at high temperatures, the leakage currents and on-state drain currents of the transistors become significantly higher under burn-in conditions. In the prior art, this problem is solved by biasing the body of the transistors with additional contacts to the body of the transistors. This solution results in a much larger circuit and a reduction in the overall performance of the IC. Consequently, it is desirable to provide a method to maintain the threshold voltage of transistors within an integrated circuit during a high-temperature burn-in test without compromising the integrity of the test.

SUMMARY OF THE INVENTION

In accordance with a preferred embodiment of the present invention, a thin-film is placed on top of an integrated circuit having multiple transistors. An infra-red filter is then placed on top of the thin-film. All the transistors of the integrated circuit are radiated by an infra-red source through the thin-film and the infra-red filter when a high-temperature burn-in test is being performed.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In order to maintain the threshold voltage of transistors within an integrated circuit (IC) during a high-temperature burn-in test, a two-step solution is provided by the present invention. First, a partially ionized dopant is introduced to the transistors such that the transistors become double doped. As a result, the threshold voltage of the transistors will not decrease significantly at high temperatures. Second, the IC is exposed to an infra-red (IR) radiation during the burn-in test in order to photoionize the partially ionized dopant that has not yet fully ionized at that point. As a result, the threshold voltage of the transistors remains high during the high-temperature burn-in test because the extra dopants within the body and channels of the transistors are ionized.

A. Double Doped Transistors

Figures 1A, 1B:
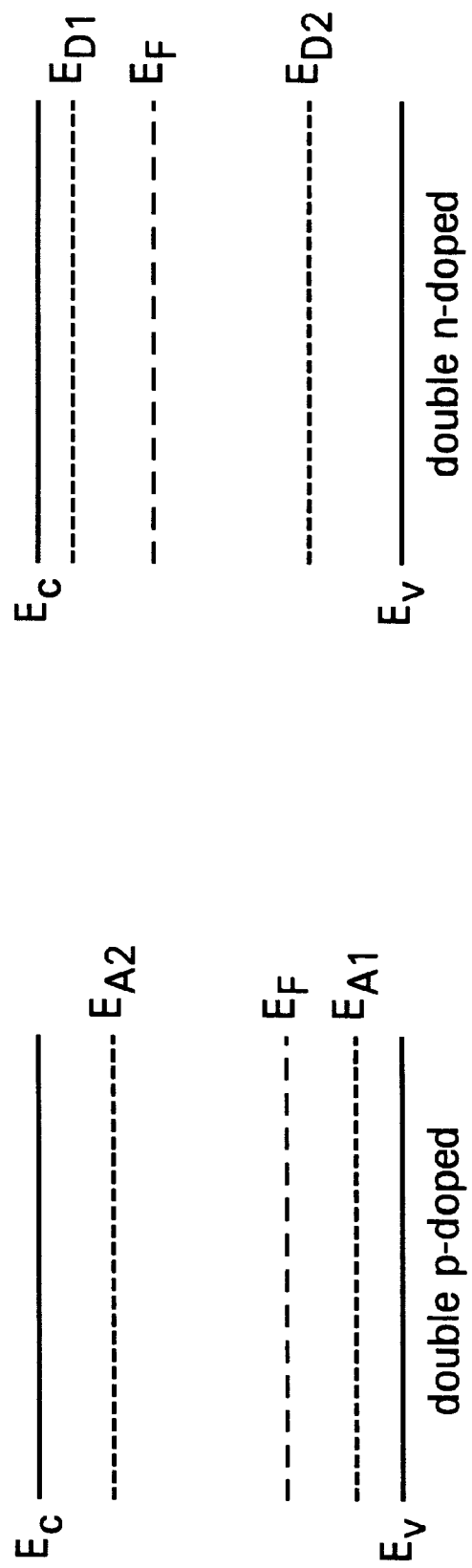
FIG. 1a is an energy band diagram of the p-doped material of an n-channel transistor, in accordance with a preferred embodiment of the present invention.
FIG. 1b is an energy band diagram of the n-doped material of a p-channel transistor, in accordance with a preferred embodiment of the present invention.

Referring now to the drawings and in particular to FIG. 1a, there is illustrated an energy band diagram of the double p-doped material of an n-channel transistor, in accordance with a preferred embodiment of the present invention. As shown, $E_v$ represents the energy level of the valence band, $E_c$ represents the energy level of the conduction band, $E_F$ represents the Fermi energy level, $E_{A1}$ represents the energy level of a first acceptor, and $E_{A2}$ represents the energy level of a second acceptor. At room temperature, the energy level of the first acceptor is closer to the valence band, and the energy level of the second acceptor is closer to the conduction band.

In a preferred embodiment, the first acceptor (or first dopant) and the second acceptor (or second dopant) for the double p-doped n-channel transistor are Boron and Platinum, respectively. Boron has an ionization energy of 0.045 eV above the valence band $E_v$, and Platinum has an ionization energy of 0.25 eV below the conduction band $E_c$. Boron and Platinum are merely illustrative and many other elements, such as Magnesium or Cadmium, could also be utilized without departing from the scope of the present invention.

The desired ionized impurity concentration for the double p-doped n-channel transistor can be estimated by:

$$N_{A1}^* = \frac{N_{A1}}{1 + 4\exp\left(\frac{E_{A1} - E_F}{kT}\right)}$$

$$N_{A2}^* = \frac{N_{A2}}{1 + 4\exp\left(\frac{E_{A2} - E_F}{kT}\right)}$$

where $N_{A1}$ is the impurity concentration of the fully ionized first acceptor and $N_{A2}$ is the impurity concentration of the partially ionized second acceptor. At low temperatures, such as room temperature, the ionized impurity concentration is close to the impurity concentration of the partially ionized second acceptor (i.e., $N_A^* \approx N_{A1}$). At higher temperatures, such as 140° C., the total ionized impurity concentration for the double p-doped n-channel transistor is the sum of the impurity concentration of the fully ionized first acceptor and the impurity concentration of the partially ionized second acceptor (i.e., $N_A^* = N_{A1} + N_{A2}$).

The equation for threshold voltage of the double p-doped n-channel transistor at high temperatures is given by:

$$V_{TH_N} = V_{FB} + 2\psi_{BN} + \frac{2\sqrt{e\epsilon_s(N_{A1}^* + N_{A2}^*)\psi_{BN}}}{C_i}$$

where $V_{FB}$ is the flat-band voltage, $\psi_{BN}$ is the band-bending at the surface of the n-channel transistor, e is the electronic charge, $\epsilon_s$ is the dielectric constant of silicon, $N_{A1}^*$ is the doping concentration of a first acceptor, $N_{A2}^*$ is the estimated doping concentration of a second acceptor, and $C_i$ is the gate oxide capacitance per unit area.

The change in threshold voltage in the double p-doped n-channel transistor can be described by:

$$\Delta V_{TH_N} \approx \frac{2\sqrt{e\epsilon_s \psi_{BN}}}{C_i}\left(\sqrt{N_{A1}^* + N_{A2}^*} - \sqrt{N_{A1}^*}\right)$$

Referring now to FIG. 1b, there is illustrated an energy band diagram of a double n-doped material of a p-channel transistor, in accordance with a preferred embodiment of the present invention. As shown, $E_v$ represents the energy level of the valence band, $E_c$ represents the energy level of the conduction band, $E_F$ represents the Fermi energy level, $E_{D1}$ represents the energy level of a first donor, and $E_{D2}$ represents the energy level of a second donor-the partially ionized dopant. Thus, at room temperature, the energy level of the first donor is closer to the conduction band, and the energy level of the second donor is closer to the valence band.

In a preferred embodiment, the first donor (or first dopant) and the second donor (or second dopant) for the double n-doped p-channel transistor are Phosphorous and Carbon, respectively. But Phosphorous and Carbon are also merely illustrative and many other elements, such as Platinum or Gold, could also be utilized without departing from the scope of the present invention.

The desired ionized impurity concentration for the double n-doped p-channel transistor can be estimated by:

$$N_{D1}^* = \frac{N_{D1}}{1 + 2\exp\left(\frac{E_F - E_{D1}}{kT}\right)}$$

$$N_{D2}^* = \frac{N_{D2}}{1 + 2\exp\left(\frac{E_F - E_{D2}}{kT}\right)}$$

where $N_{D1}$ is the impurity concentration of the fully ionized donor dopants and $N_{D2}$ is the impurity concentration of the partially ionized donor dopants. At low temperatures, such as room temperature, the impurity concentration of the fully ionized donor dopants is about the same as the impurity concentration of the partially ionized donor dopants (i.e., $N_D^* \approx N_{D1}$). However, at higher temperatures, such as 140° C., the total ionized impurity concentration for the double n-doped p-channel transistor is the sum of the impurity concentration of the fully ionized donor dopants and the impurity concentration of the partially ionized donor dopants (i.e., $N_D^* = N_{D1} + N_{D2}$).

The equation for threshold voltage of the double n-doped p-channel transistor is given by:

$$V_{TH_P} = V_{FB} + 2\psi_{BP} + \frac{2\sqrt{e\epsilon_s(N_{D1}^* + N_{D2}^*)\psi_{BP}}}{C_i}$$

where $V_{FB}$ is the flat-band voltage, $\psi_{BP}$ is the band-bending at the surface of the p-channel transistor, e is the electronic charge, $\epsilon_s$ is the dielectric constant of silicon, $N_{D1}^*$ is the doping concentration of a first donor, $N_{D2}^*$ is the estimated doping concentration of a second donor, and $C_i$ is the gate oxide capacitance per unit area.

The change in threshold voltage in the double n-doped p-channel transistor can be described by the equation below:

$$\Delta V_{TH_P} \approx \frac{2\sqrt{e\epsilon_s \psi_{BP}}}{C_i}\left(\sqrt{N_{D1}^* + N_{D2}^*} - \sqrt{N_{D1}^*}\right)$$

Figure 2:
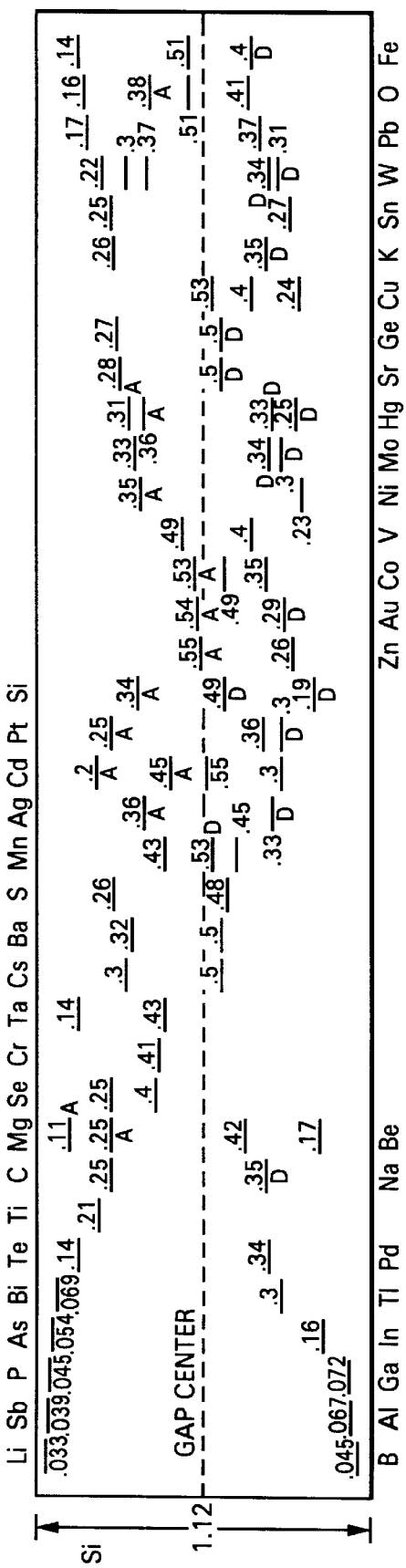
FIG. 2 is a chart of elements that are good candidates for use as partially ionized dopants according to the present invention.

With reference now to FIG. 2, there is illustrated a chart of ionization energies of different dopants in silicon. If an element has an ionization energy in silicon that is below the band gap center and has a "D" associated with its stated ionization energy, then the element is a good candidate for use as an electron donor. Alternatively, if an element has an ionization energy in silicon that is above the band gap energy and has an "A" associated with its stated ionization energy, then the element is a good candidate for use as an electron acceptor.

B. Infra-red Radiation

Even with the double-doped process, the threshold voltage of the transistors remains low at high temperatures because some dopants within the body and channels of transistors are not fully ionized. Thus, an infra-red (IR) source is utilized to increase the threshold voltage of these transistors. With the radiation from the IR source, photons are absorbed by the partially ionized dopants and electrons are excited to a higher state. When the electrons are in a higher state, the threshold voltage of the transistors increases.

Specifically, discrete wavelengths of light from the IR source are absorbed by an atom as an atom makes a transition from a state of lower energy to an excited state. The characteristics of the composition of an atom dictate what frequency of photon energy will be absorbed by the atom. In a preferred embodiment, $h\upsilon_N = E_{A2} - E_v$ for the p-doped n-channel transistors and $h\upsilon_P = E_c - E_{D2}$ for the n-doped p-channel transistors, where h is the Planks constant and $\upsilon$ is the frequency of the IR light. The dopants are ionized only if $E_F > E_A + 2$ kT for the p-doped n-channel transistors and $E_F < E_D + 2$ kT for the n-doped p-channel transistors.

The efficiency of photon absorption depends on the radiation by the proper wavelength of IR source. Further, the intensity level of the IR source is very low such that there will be no detectable heating of the IC by the radiation from the IR source.

Figure 3:
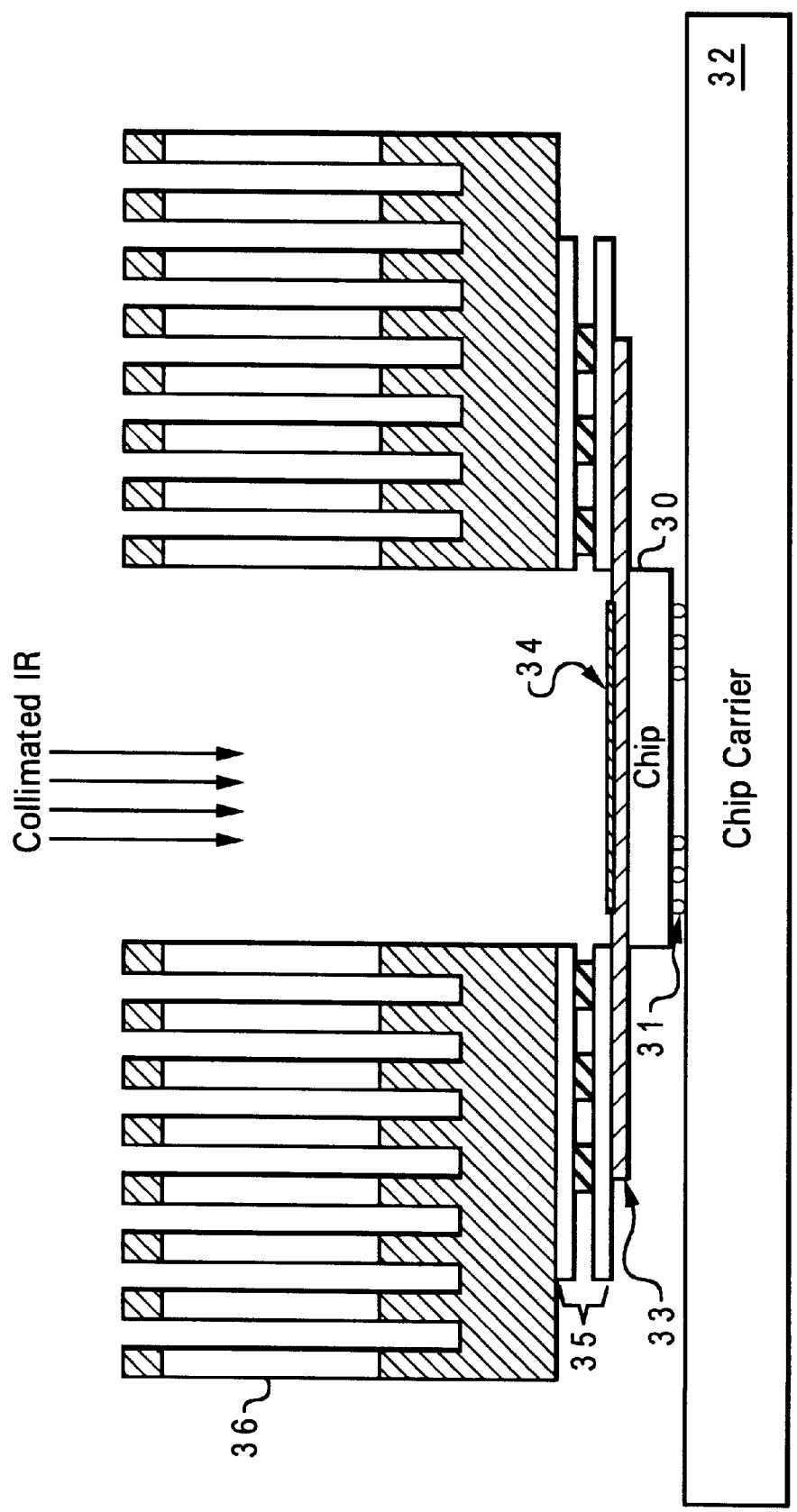
FIG. 3 is a pictorial diagram of a physical arrangement for performing a high-temperature burn-in test on ICs, in accordance with a preferred embodiment of the present invention.

Referring now to FIG. 3, there is illustrated a pictorial diagram of a physical arrangement for performing a high-temperature burn-in test on ICs, in accordance with a preferred embodiment of the present invention. As shown, an IC 30 is affixed on a chip carrier 32 via solder bumps 31. In order to provide a high-temperature burn-in test on IC 30, a layer of thin-film 33, an IR filter 34, and a thermoelectric cooler 35 along with a heat spreader 36 is placed on top of IC 30 as shown in FIG. 3.

Thin-film 33 is utilized to conduct heat from IC 30 to thermoelectric cooler 35. Thin-film 33 is preferably made of diamond because of its high thermal conductivity (2000 W/m-K). In addition, diamond is also transparent to IR.

IR filter 34 can be adjusted to increase the Rayleigh resolution beyond the 0.5 μm limit imposed by an IR source. Many different types of IR filters can be utilized to selectively photoionize IC 30. Selective filtering would be useful to accommodate the differing ionization requirements of different functional areas of IC 30. For example, a cache memory may require a lower intensity of IR radiation than an input and/or output of IC 30.

IR radiation can be provided by many sources. Light Emitting Diodes (LEDs) that are based on direct band gap materials can be utilized to supply photons locally. Gallium Arsenide (GaAs) or Gallium Indigo Arsenide (GaInAs) devices can be tailored to produce high quantum efficiency IR wavelengths that closely match the absorption profile of the dopants in the silicon. The incident IR radiation is preferably collimated such that the IR radiation pattern is uniform. Thermoelectric cooler 356 and heat exchanger 36 are provided to lower the operating temperature of IC circuit 30.

Figure 4:
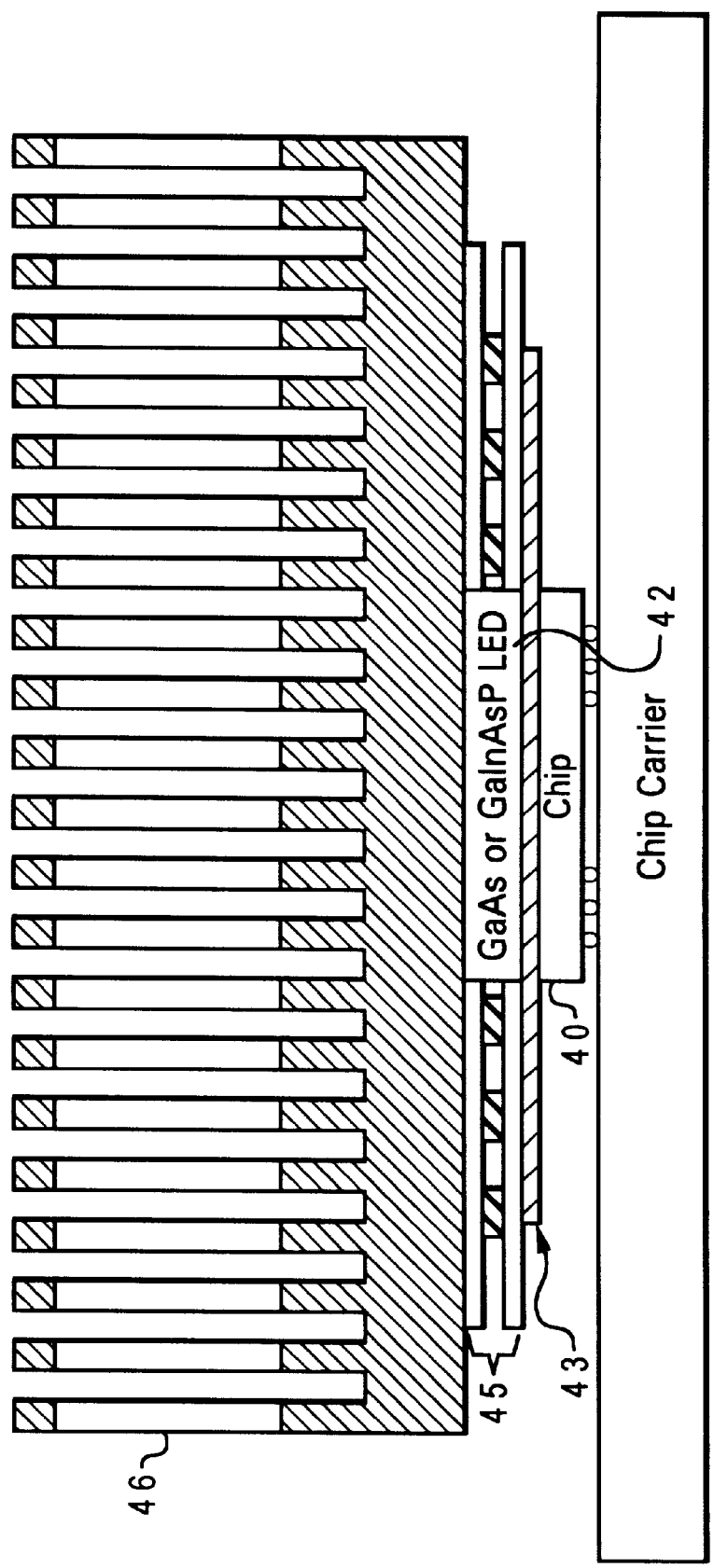
FIG. 4 is a pictorial diagram of a physical arrangement for performing a high-temperature burn-in test on ICs, in accordance with an alternative embodiment of the present invention.

With reference now to FIG. 4, there is illustrated a pictorial diagram of a physical arrangement for performing a high-temperature burn-in test on ICs, in accordance with an alternative embodiment of the present invention. This arrangement provides greater heat transfer capacity because the cooling apparatus (i.e., thermoelectric cooler 45 and heat spreader 46), can dissipate more heat into the ambient environment. Forced convection could also be utilized to enhance heat transfer. In addition, LEDs 42 are placed in close proximity to IC 40. These LEDs are preferably GaAs LEDs or GaInAs LEDs. Thin-film 43 is placed between IC 40 and LEDs 42. As described above, thin-film 43 is utilized to conduct heat from IC 40 to thermoelectric cooler 45.

As has been described, the present invention provides an improved method for performing a high-temperature burn-in test on integrated circuits.

While the invention has been particularly shown and described with reference to a preferred embodiment, it will be understood by those skilled in the art that various changes in form and detail may be made therein without departing from the spirit and scope of the invention.

What is claimed is:

1. A method for performing a high-temperature burn-in test on integrated circuits, said method comprising the steps of:
    placing an infra-red filter on top of an integrated circuit having a plurality of transistors; and
    radiating said plurality of transistors of said integrated circuit by an infra-red light source through said infra-red filter when a high-temperature burn-in test is being performed.

2. The method according to claim 1, wherein said method further includes a step of placing a thin-film between said infra-red filter and said integrated circuit.

3. The method according to claim 2, wherein said thin-film is a diamond thin-film.

4. The method according to claim 1, wherein said radiating step further includes a step radiating said plurality of transistors of said integrated circuit by a collimated infra-red light source.

5. The method according to claim 1, wherein said method further includes a step of fabricating said plurality of transistors by doping a region of said plurality of transistors with a first dopant having a first energy level and a second dopant having a second energy level.

6. The method according to claim 1, wherein said first dopant and said second dopant are acceptors for an n-channel transistor.

7. The method according to claim 6, wherein said first dopant is Boron.

8. The method according to claim 6, wherein said second dopant is one of following elements: Platinum, Magnesium, or Cadmium.

9. The method according to claim 1, wherein said first dopant and said second dopant are donors for a p-channel transistor.

10. The method according to claim 9, wherein said first dopant is Phosphorous.

11. The method according to claim 9, wherein said second dopant is one of following elements: Platinum, Gold, or Carbon.

12. An apparatus for performing a high-temperature burn-in test on integrated circuits, said apparatus comprising:
    an integrated circuit having a plurality of transistors;
    an infra-red filter placed on top of said integrated circuit; and
    an infra-red light source for radiating said plurality of transistors of said integrated circuit through said infra-red filter during a high-temperature burn-in test is being performed.

13. The apparatus according to claim 12, wherein said apparatus further includes a thin-film placed between said infra-red filter and said integrated circuit.

14. The apparatus according to claim 13, wherein said thin-film is a diamond thin-film.

15. The apparatus according to claim 12, wherein said infra-red light source is a collimated infra-red light source.

16. The apparatus according to claim 12, wherein said plurality of transistors is fabricated by doping a region of said plurality of transistors with a first dopant having a first energy level and a second dopant having a second energy level.

17. The apparatus according to claim 16, wherein said first dopant and said second dopant are acceptors for an n-channel transistor.

18. The apparatus according to claim 17, wherein said first dopant is Boron and said second dopant is one of following elements: Platinum, Magnesium, or Cadmium.

19. The apparatus according to claim 16, wherein said first dopant and said second dopant are donors for a p-channel transistor.

20. The apparatus according to claim 19, wherein said first dopant is Phosphorous and said second dopant is one of following elements: Platinum, Gold, or Carbon.

* * * * *